(12) United States Patent
Chang et al.

(10) Patent No.: US 12,237,211 B2
(45) Date of Patent: Feb. 25, 2025

(54) BONDING SYSTEM WITH SEALING GASKET AND METHOD FOR USING THE SAME

(71) Applicant: Taiwan Semiconductor Manufacturing Co., Ltd., Hsinchu (TW)

(72) Inventors: Chieh Chang, Hsinchu (TW); Chen-Fong Tsai, Hsinchu (TW); Yun Chen Teng, New Taipei (TW); Han-De Chen, Hsinchu (TW); Jyh-Cherng Sheu, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 737 days.

(21) Appl. No.: 17/377,667

(22) Filed: Jul. 16, 2021

(65) Prior Publication Data
US 2022/0367249 A1 Nov. 17, 2022

Related U.S. Application Data

(60) Provisional application No. 63/187,567, filed on May 12, 2021.

(51) Int. Cl.
*H01L 21/762* (2006.01)
*H01L 21/67* (2006.01)

(52) U.S. Cl.
CPC .. *H01L 21/76251* (2013.01); *H01L 21/67092* (2013.01)

(58) Field of Classification Search
CPC ......... H01L 21/76251; H01L 21/67092; H01L 21/187; H01L 21/2007; H01L 21/76254; H01L 21/67126; H01L 21/6838; H01L 21/67121; H01L 24/94; H01L 2224/94; H01L 2224/95091
See application file for complete search history.

(56) References Cited

U.S. PATENT DOCUMENTS

2021/0057373 A1\* 2/2021 Kim ................. H01L 24/16

\* cited by examiner

*Primary Examiner* — John P. Dulka
(74) *Attorney, Agent, or Firm* — Slater Matsil, LLP

(57) ABSTRACT

A method of forming a semiconductor device includes mounting a bottom wafer on a bottom chuck and mounting a top wafer on a top chuck, wherein one of the bottom chuck and the top chuck has a gasket. The top chuck is moved towards the bottom chuck. The gasket forms a sealed region between the bottom chuck and the top chuck around the top wafer and the bottom wafer. An ambient pressure in the sealed region is adjusted. The top wafer is bonded to the bottom wafer.

20 Claims, 19 Drawing Sheets

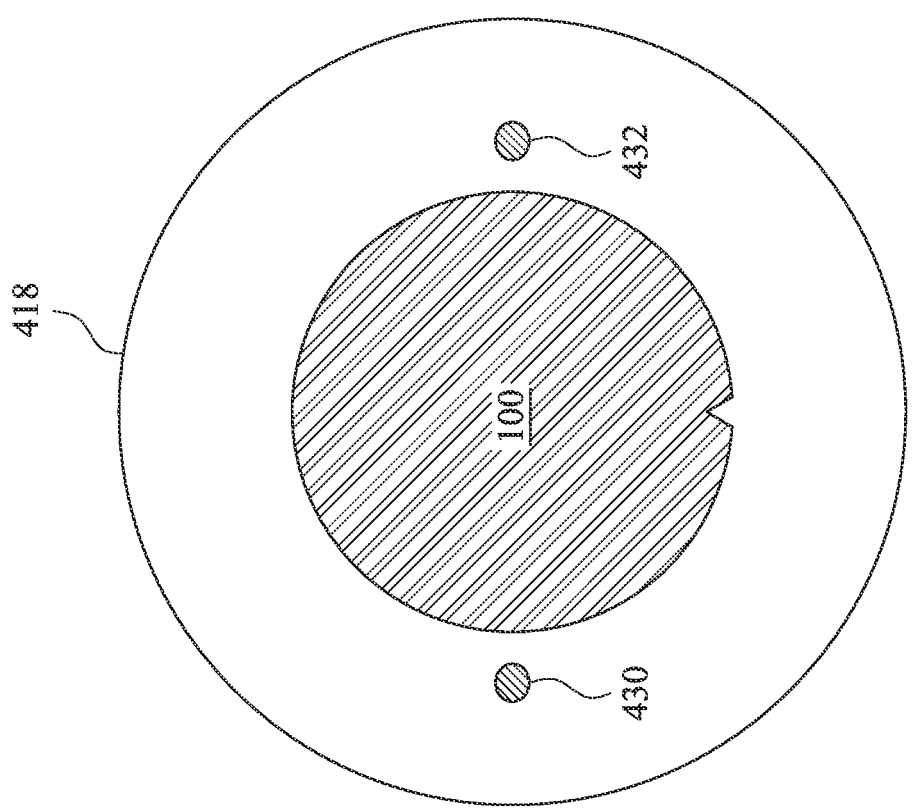

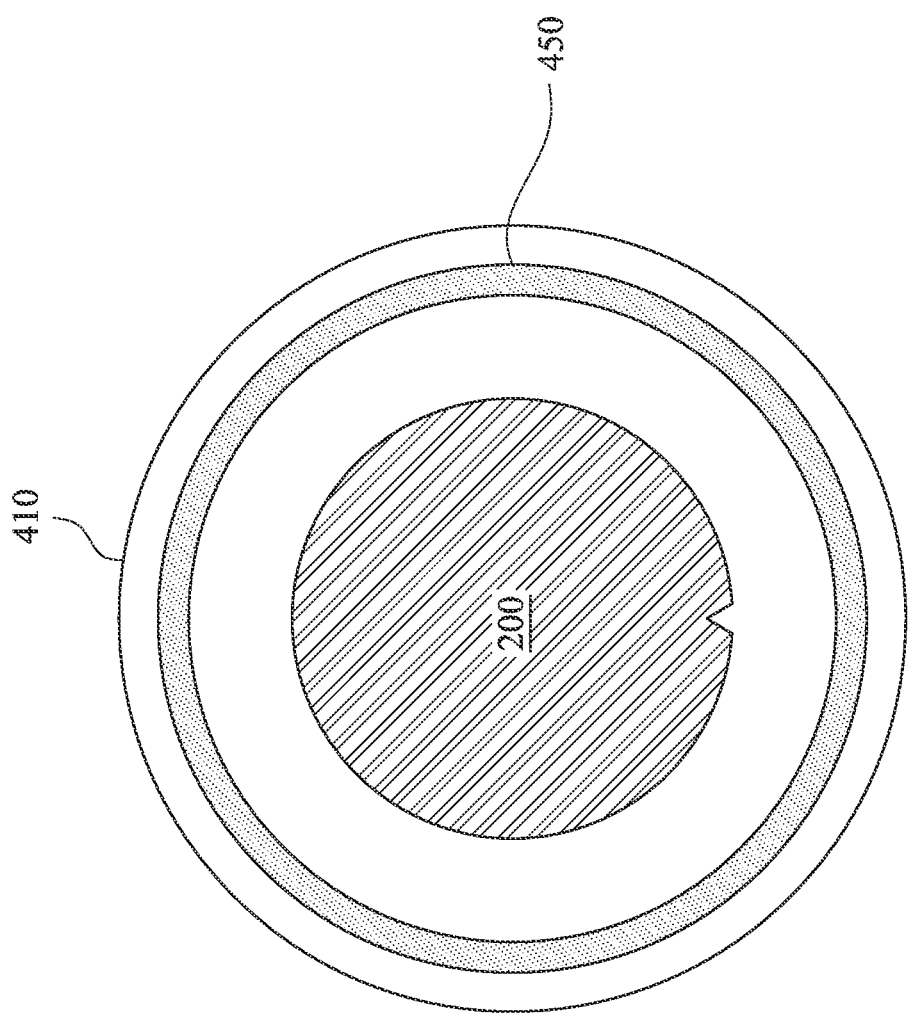

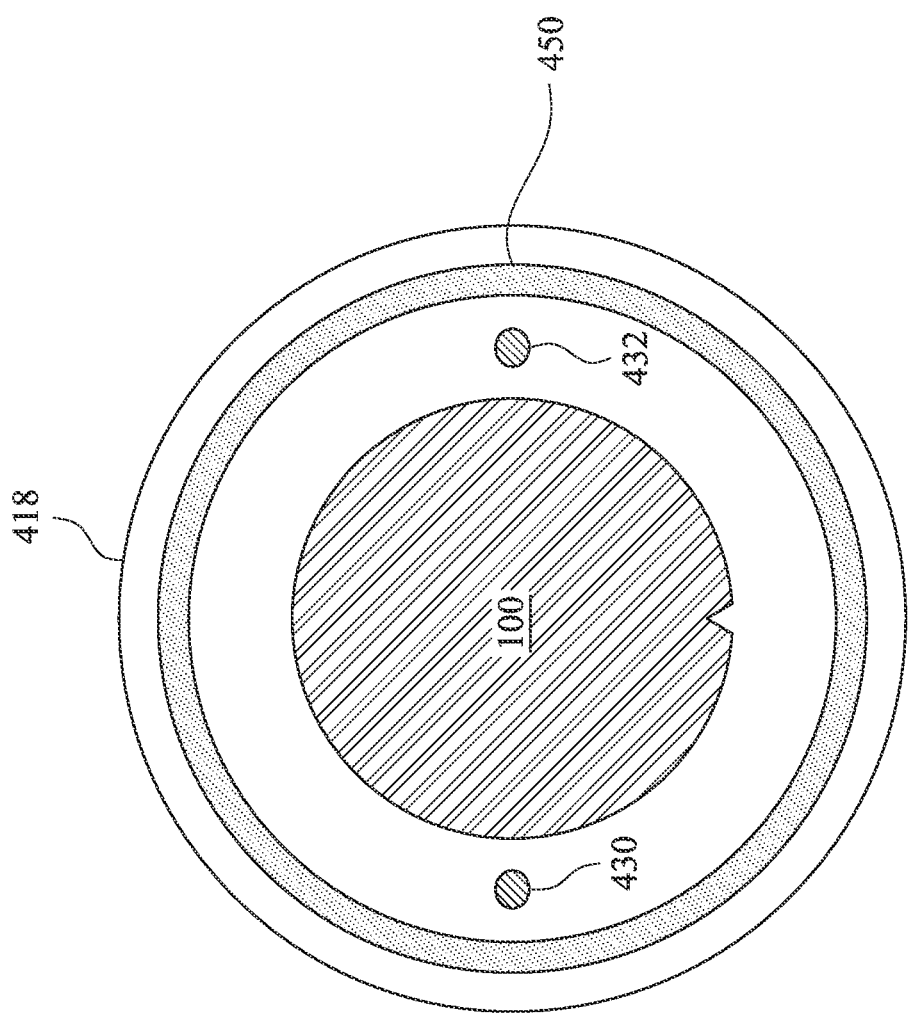

BONDING SYSTEM WITH SEALING GASKET AND METHOD FOR USING THE SAME

PRIORITY CLAIM AND CROSS-REFERENCE

This application claims the benefit of U.S. Provisional Application No. 63/187,567, filed on May 12, 2021, which application is hereby incorporated herein by reference.

BACKGROUND

In wafer-to-wafer bonding technology, various methods have been developed to bond two package components (such as wafers) together. The available bonding methods include fusion bonding, eutectic bonding, direct metal bonding, hybrid bonding, and the like. In fusion bonding, an oxide surface of a wafer is bonded to an oxide surface or a silicon surface of another wafer. In eutectic bonding, two eutectic materials are placed together, and a high pressure and a high temperature are applied. The eutectic materials are hence melted. When the melted eutectic materials solidify, the wafers bond together. In direct metal-to-metal bonding, two metal pads are pressed against each other at an elevated temperature, and the inter-diffusion of the metal pads causes the bonding of the metal pads. In hybrid bonding, the metal pads of two wafers are bonded to each other through direct metal-to-metal bonding, and an oxide surface of one of the two wafers is bonded to an oxide surface or a silicon surface of the other wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4C illustrates a top view of a wafer chuck in a bonding system, in accordance with some embodiments.

FIG. 5B illustrates a bottom view of a wafer chuck in a bonding system, in accordance with some embodiments.

FIG. 5C illustrates a top view of a wafer chuck in a bonding system, in accordance with some embodiments.

DETAILED DESCRIPTION

Figure 1:
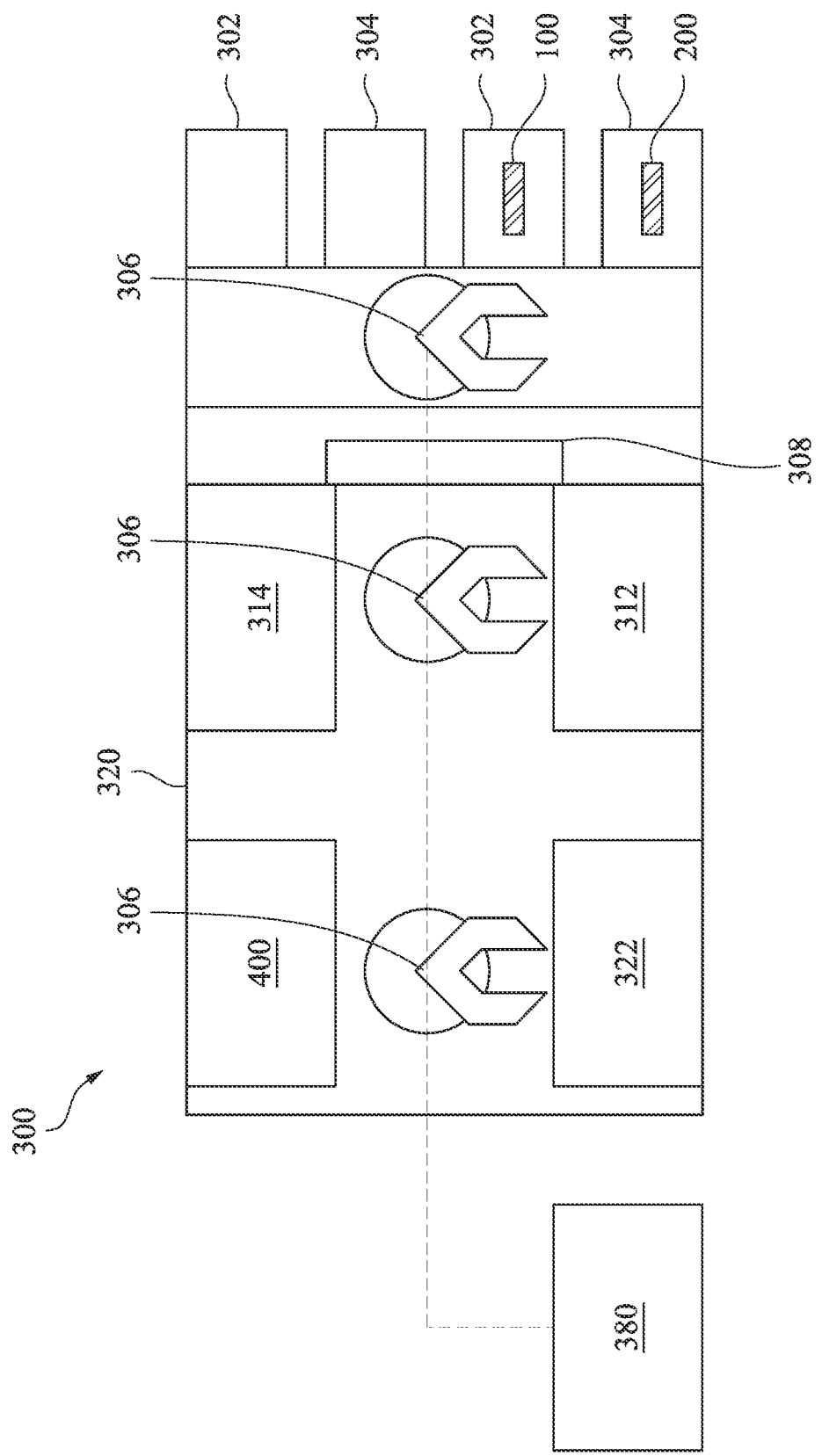
FIG. 1 illustrates a top-view of a bonding system in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a wafer bonding system is utilized. The wafer bonding system allows for the bonding of a first wafer to a second wafer in an airtight local process chamber by controlling the ambient pressure. The local process chamber is sealed by a gasket between wafer chucks holding the first and second wafers. The ambient pressure inside the local process chamber may be quickly adjusted and maintained, which can enable increased throughput and reduced cost for the bonding process. Reducing the pressure in the local process chamber enables the wafer bonding system to bond wafers together at a faster rate and increase the wafer per hour (WPH) processing rate.

Increasing the pressure in the local process chamber reduces local stresses and bonding-induced distortion of the bonded wafers caused by uneven bonding wave velocity. The airtight seal of the local process chamber enables a gaseous purge capability to reduce moisture and decrease edge bubble defects.

FIG. 1 shows a top view of a wafer bonding system 300 that may be used to bond a wafer 100 with a wafer 200. The process flow in accordance with the embodiments is briefly described below, and the details of the process flow and the wafer bonding system 300 are discussed, referencing FIGS. 2 through 10. In some embodiments, the wafer bonding system 300 can be used to bond the wafers 100 and 200 through semiconductor-on-insulator (SOI) bonding, fusion bonding (e.g., hydrophilic bonding or hydrophobic bonding), eutectic bonding, hybrid bonding, or the like. However, any suitable method of bonding may be utilized.

The wafers 100 and 200 may be semiconductor wafers, such as silicon wafers, or semiconductor substrates, such as bulk semiconductors, a semiconductor-on-insulator (SOI) substrate, or the like, which may be doped (e.g., with a p-type or an n-type dopant) or undoped. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the wafers 100 and 200 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. In some embodiments, the wafers 100 and 200 comprise silicon, silicon germanium, combinations of these, or the like, and outer surfaces of the wafers 100 and 200 to be bonded may have a Si—O—Si crystalline structure.

In some embodiments, the wafers 100 and 200 are package components comprising a device wafer, a package substrate, an interposer wafer, or the like. In the embodiments in which the wafer 100 comprises a device wafer, the wafer 100 may include a semiconductor substrate, which may be, for example, a silicon substrate, although other semiconductor substrates are also usable. Active devices may be formed on a surface of the substrate, and may include, for example, transistors. Metal lines and vias may be formed in dielectric layers over the substrate, which may be low-k dielectric layers in some embodiments. The low-k dielectric layers may have dielectric constants (k values) lower than, for example, about 3.5, lower than about 3.0, or lower than about 2.5. The dielectric layers may also comprise non-low-k dielectric materials with dielectric constants (k values) greater than 3.9. The metal lines and vias may comprise copper, aluminum, nickel, tungsten, or alloys thereof. The metal lines and vias interconnect the active devices, and may connect the active devices to overlying metal pads formed on the dielectric layers. In some embodiments, the wafer 100 is an interposer wafer, which is free from active devices therein. The wafer 100 may or may not include passive devices (not shown) such as resistors, capacitors, inductors, transformers, and the like in accordance with some embodiments. In some embodiments, the wafer 100 is a package substrate. In some embodiments, the wafer 100 includes laminate package substrates, wherein conductive traces are embedded in laminate dielectric layers. In some embodiments, the wafers 100 and 200 are build-up package substrates, which comprise cores and conductive traces built on the opposite sides of the cores.

In some embodiments, the wafer bonding system 300 comprises loading stations 302 and 304, transfer robots 306 to move wafers between areas of the wafer bonding system 300, a controller 380, and a bonding area 320 containing a pre-alignment module 312, a surface treatment station 314, a cleaning station 322, and a bonding station 400. However, more or fewer stations may be utilized within the wafer bonding system 300. In some embodiments, the controller 380 comprises a programmable computer. The controller 380 is illustrated as a single element for illustrative purposes. In some embodiments, the controller 380 comprises multiple elements. The controller 380 may be connected to the transfer robots 306 and may be configured to move the wafers 100 and 200 through the bonding process.

To start the bonding process, the wafers that are to be bonded (for example, wafers 100 and 200) are loaded into the wafer bonding system 300 through one or more of the loading stations 302 and 304. For example, in some embodiments loading stations 302 are front opening unified pods (FOUPs) used to load wafers 100 (e.g., bottom wafers) and loading stations 304 are FOUPs used to load wafers 200 (e.g., top wafers). However, any suitable methods and loading stations may be utilized.

A transfer robot 306 adjacent to both the loading stations 302 and the bonding area 320 receives the wafers 100 and 200 from the loading stations 302 and 304 and places them into a load-lock 308 for the bonding area 320. The bonding area 320 may be a vacuum environment (a vacuum chamber). Furthermore, the bonding area 320 may be surrounded by a chamber housing 315 (see below, FIG. 2) made of material that is inert to the various process materials. As such, while the bonding area 320 may be any suitable material that can withstand the chemistries and pressures involved in the treatment process, in an embodiment the bonding area 320 may be steel, stainless steel, nickel, aluminum, alloys of these, combinations of these, and the like.

The bonding area 320 may also be connected to one or more vacuum pumps 406 (see below, FIG. 2) for exhaust from the bonding area 320. In an embodiment the vacuum pump 406 is under the control of the controller 380, and may be utilized to control the pressure within the bonding area 320 to a desired pressure. Additionally, once the bonding process is completed, the vacuum pump 406 may be utilized to evacuate the bonding area 320 in preparation for removal of the wafers 100 and 200.

In the bonding area 320, the wafers 100 and 200 are transferred by a transfer robot 306 to a pre-alignment module 312. In an embodiment the pre-alignment module 312 may comprise one or more rotating arms which can rotate the wafers 100 and 200 to any desired rotational position using, e.g., a notch located within the wafers 100 and 200 (see below, FIG. 5C). However, any suitable angular position may be utilized.

Figure 2A:
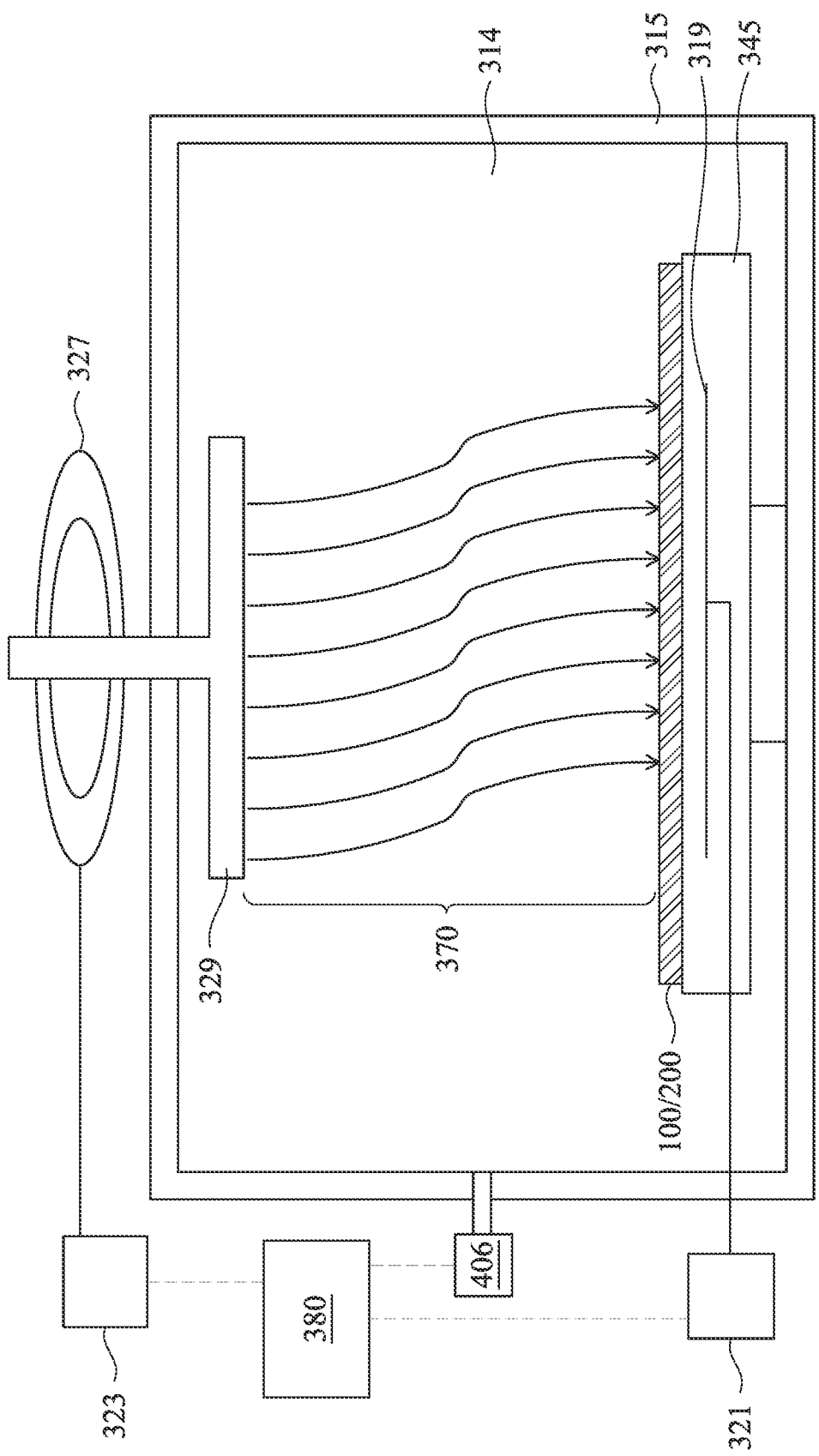
FIG. 2A illustrates a cross-sectional view of an intermediate step in a bonding process, in accordance with some embodiments.

Next, referring to FIG. 2A, a transfer robot 306 within the bonding area 320 transfers the wafers 100 and 200 from the pre-alignment module 312 to the surface treatment station 314. In some embodiments, the surface treatment station 314 is utilized to perform a surface treatment 370, or surface activation, on the surfaces of the wafers 100 and 200. In some embodiments, the surface treatment 370 includes a plasma activation step, a liquid activation step, combinations of these, or the like. However, any suitable surface treatment may be utilized.

Within the surface treatment station 314 is located a mounting platform 345 in order to position and control the wafers 100 and 200 during surface treatment 370. The mounting platform 345 may hold one or more of the wafers 100 and 200 using a combination of clamps, vacuum pressure, and/or electrostatic forces, and may also include heating and cooling mechanisms in order to control the temperature of the wafers 100 and 200 during the processes.

Additionally, in embodiments in which the surface treatment 370 is a plasma activation treatment, the mounting platform 345 may further comprise a lower electrode 319 coupled to a first RF generator 321. The lower electrode 319 may be electrically biased by the first RF generator 321 (which may be connected to and under control of the controller 380) at a RF voltage during the surface treatment 370. By being electrically biased, the lower electrode 319 is used to provide a bias to the incoming treatment gases and assist to ignite them into a treatment plasma. Additionally, the lower electrode 319 is also utilized to maintain the plasma during the surface treatment 370.

Furthermore, while a single mounting platform 345 is illustrated in FIG. 2A, this is merely intended for clarity and is not intended to be limiting. Rather, any number of mounting platforms 345 may additionally be included within the surface treatment station 314. As such, multiple semiconductor substrates may be treated simultaneously.

Additionally, the surface treatment station 314 comprises a showerhead 329. The showerhead 329 receives the treatment plasma and helps to disperse the treatment plasma into the surface treatment station 314. In some embodiments, the showerhead 329 is designed to evenly disperse the treatment gases in order to minimize undesired process conditions that may arise from uneven dispersal and has a circular design with openings dispersed evenly around the showerhead 329 to allow for the even dispersal of the treatment plasma into the surface treatment station 314. However, any suitable number and distribution of openings can be used.

The surface treatment station 314 also comprises an upper electrode 327, for use as a plasma generator. In an embodiment the plasma generator may be a transformer coupled plasma generator and may be, e.g., a coil. The coil may be attached to a second RF generator 323 that is utilized to provide power to the upper electrode 327 (which may be connected to and under control of the controller 380) in order to ignite the plasma during introduction of the treatment gases.

However, while the upper electrode 327 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may be utilized. All such methods are fully intended to be included within the scope of the embodiments.

In the surface treatment 370, the exposed surfaces of the wafers 100 and 200 are activated. For example, in an embodiment, the bonding area may initially be purged with an inert gas ambient such as e.g. Ar, $N_2$, the like, or a combination thereof. Once purged a process gas used for generating the plasma may be nitrogen ($N_2$), oxygen ($O_2$), or an $N_2/O_2$ mixture and may be introduced into the surface treatment station 314 through the showerhead 329. However, any suitable process gas may be used to generate the plasma.

Figure 2B:
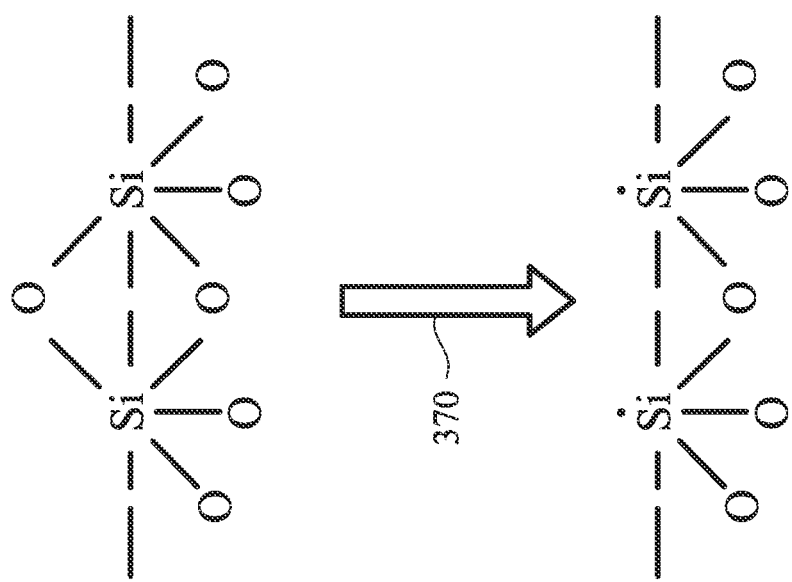
FIG. 2B illustrates a chemical reaction of an intermediate step in a bonding process, in accordance with some embodiments.

FIG. 2B illustrates the effect of the surface treatment 370 on the surfaces of the wafers 100 and 200, in accordance with some embodiments in which the wafers 100 and 200 are silicon wafers to be subsequently bonded by oxide-oxide bonding. The surface treatment 370 acts to remove oxygen atoms from silicon atoms on top surfaces of a silicon oxide layer on the wafers 100 and 200. This activates the surfaces of the wafers 100 and 200 in preparation for subsequent oxide-oxide bonding.

Figure 3A:
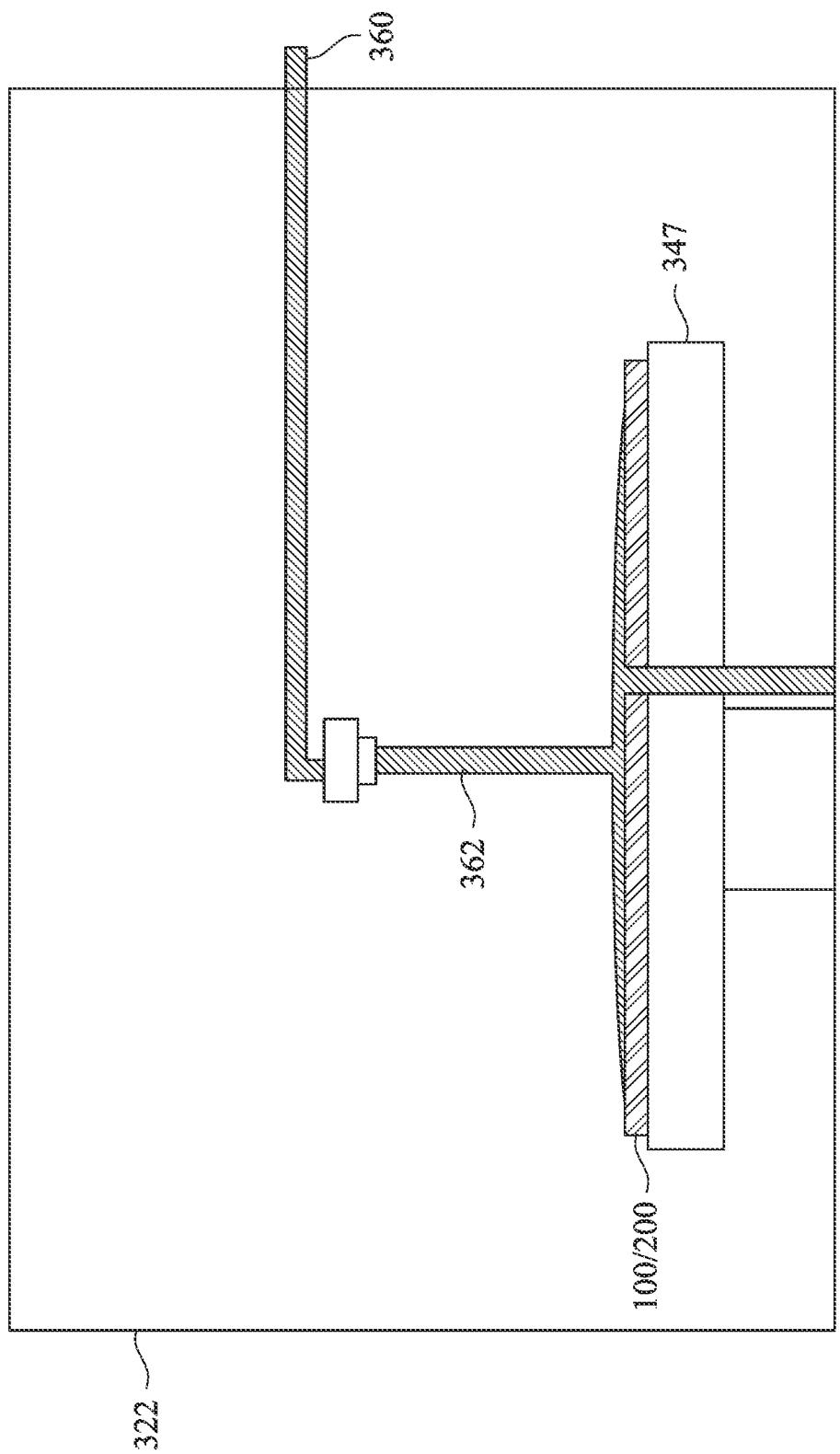
FIG. 3A illustrates a cross-sectional view of an intermediate step in a bonding process, in accordance with some embodiments.

Referring to FIG. 1 and FIG. 3A (with FIG. 3A illustrating a view of the cleaning station 322 in FIG. 1), once the surface treatment 370 has been performed, a transfer robot 306 transfers the wafers 100 and 200 to the cleaning station 322. The cleaning station 322 may be used to perform a cleaning step on the wafers 100 and 200 to remove metal oxides, chemicals, particles, and other undesirable substances from the surfaces of the wafers 100 and 200 prior to bonding.

In an embodiment the cleaning station 322 comprises a mounting station 347 and a faucet 360. The mounting station 347 may be similar to the mounting platform 345 described above with respect to FIG. 2. For example, the mounting station 347 may hold one or more of the wafers 100 and 200 using a combination of clamps, vacuum pressure, and/or electrostatic forces, and may also include heating and cooling mechanisms. However, any suitable devices for holding the wafers 100 and 200 may be utilized.

The faucet 360 is positioned over the mounting station 347 in order to dispense one or more cleaning agents over wafers 100 and 200 when the wafers 100 and 200 are mounted in the mounting station 347. During the cleaning step, the wafers 100 and 200 are mounted in the mounting station 347 and a cleaning agent 362 is then dispensed from the faucet 360 over the wafers 100 and 200. In some embodiments, the cleaning agent 362 is deionized (DI) water. In other embodiments the cleaning agent 362 comprises, in addition to DI water, a chemical such as $NH_3$, $H_2O_2$, citric acid, or the like. However, any suitable cleaning agent 362 may be utilized.

Figure 3B:
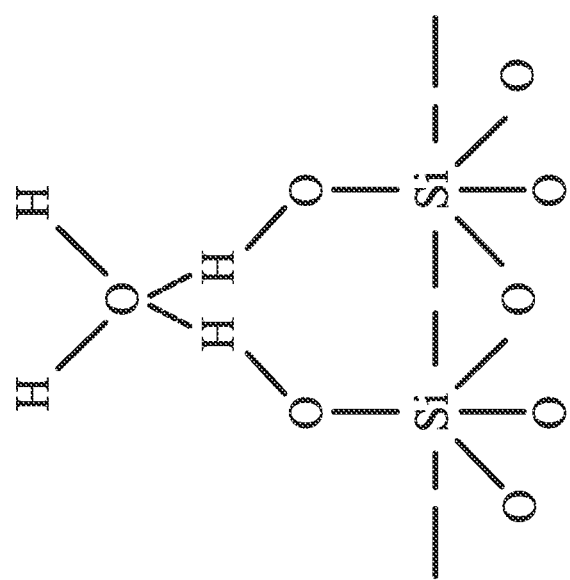
FIG. 3B illustrates a chemical reaction of an intermediate step in a bonding process, in accordance with some embodiments.

FIG. 3B illustrates the effect of the cleaning agent 362 on the surfaces of the wafers 100 and 200, in accordance with some embodiments in which the wafers 100 and 200 are silicon wafers to be subsequently bonded by oxide-oxide bonding and the cleaning agent 362 comprises water. Silanol groups form on the activated surface of the wafers 100 and 200 and water molecules attach to the silanol groups, which is advantageous for subsequent oxide-oxide bonding between the wafers 100 and 200.

Figure 4A:
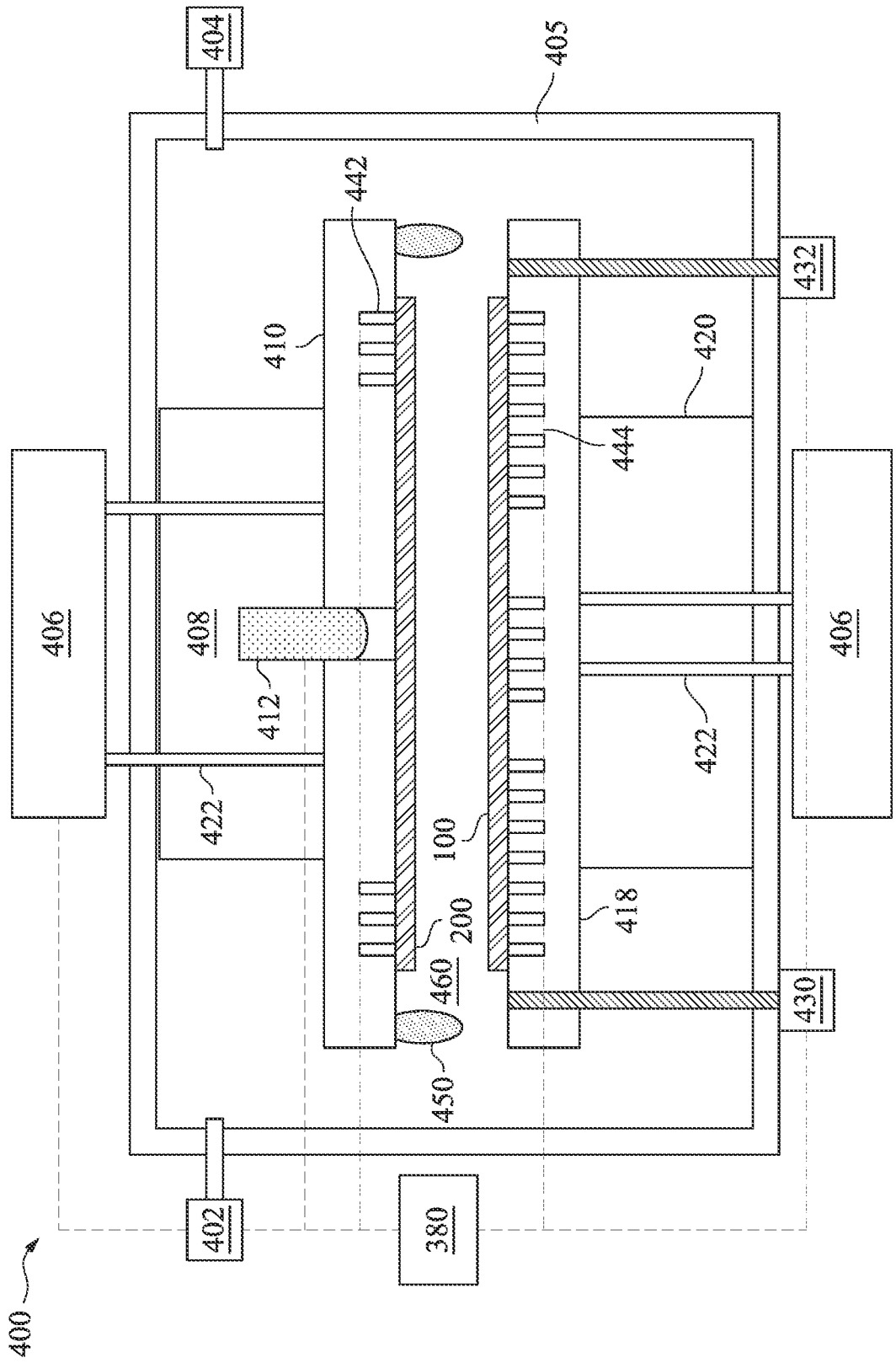
FIG. 4A illustrates a cross-sectional view of an intermediate step in a bonding process, in accordance with some embodiments.
Figure 4B:
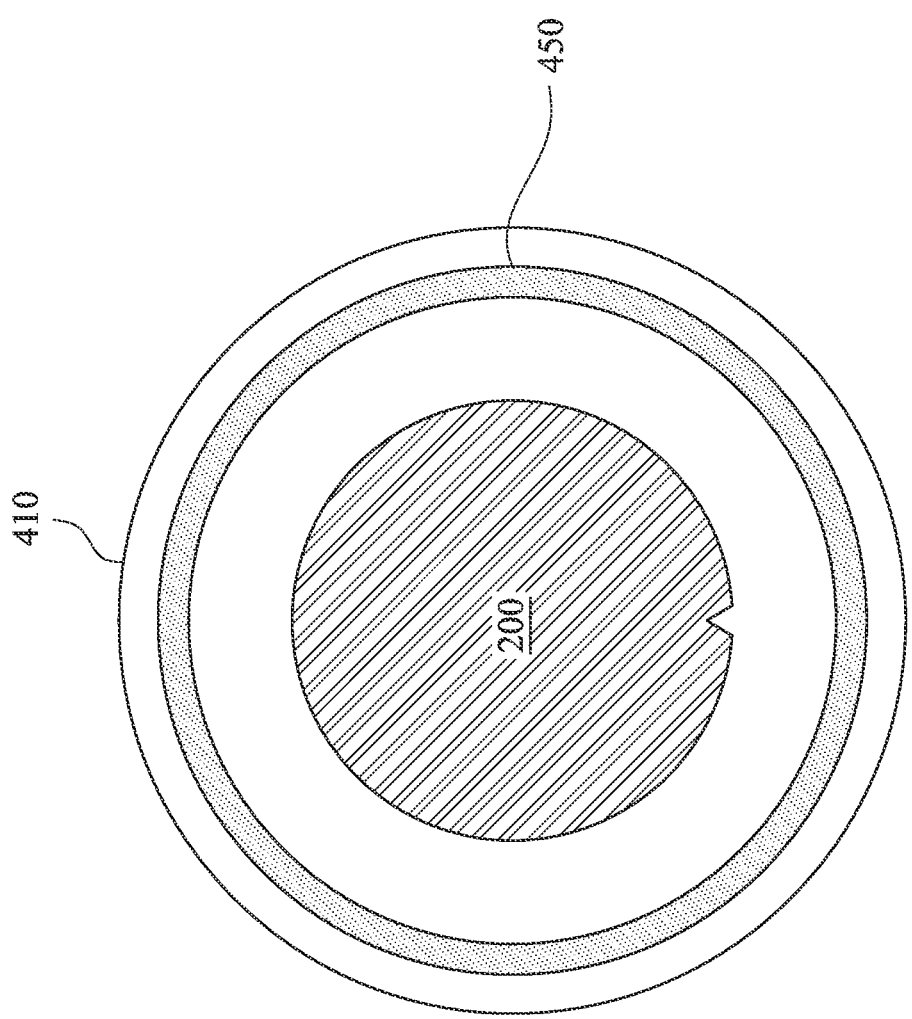
FIG. 4B illustrates a bottom view of a wafer chuck in a bonding system, in accordance with some embodiments.
Figure 4D:
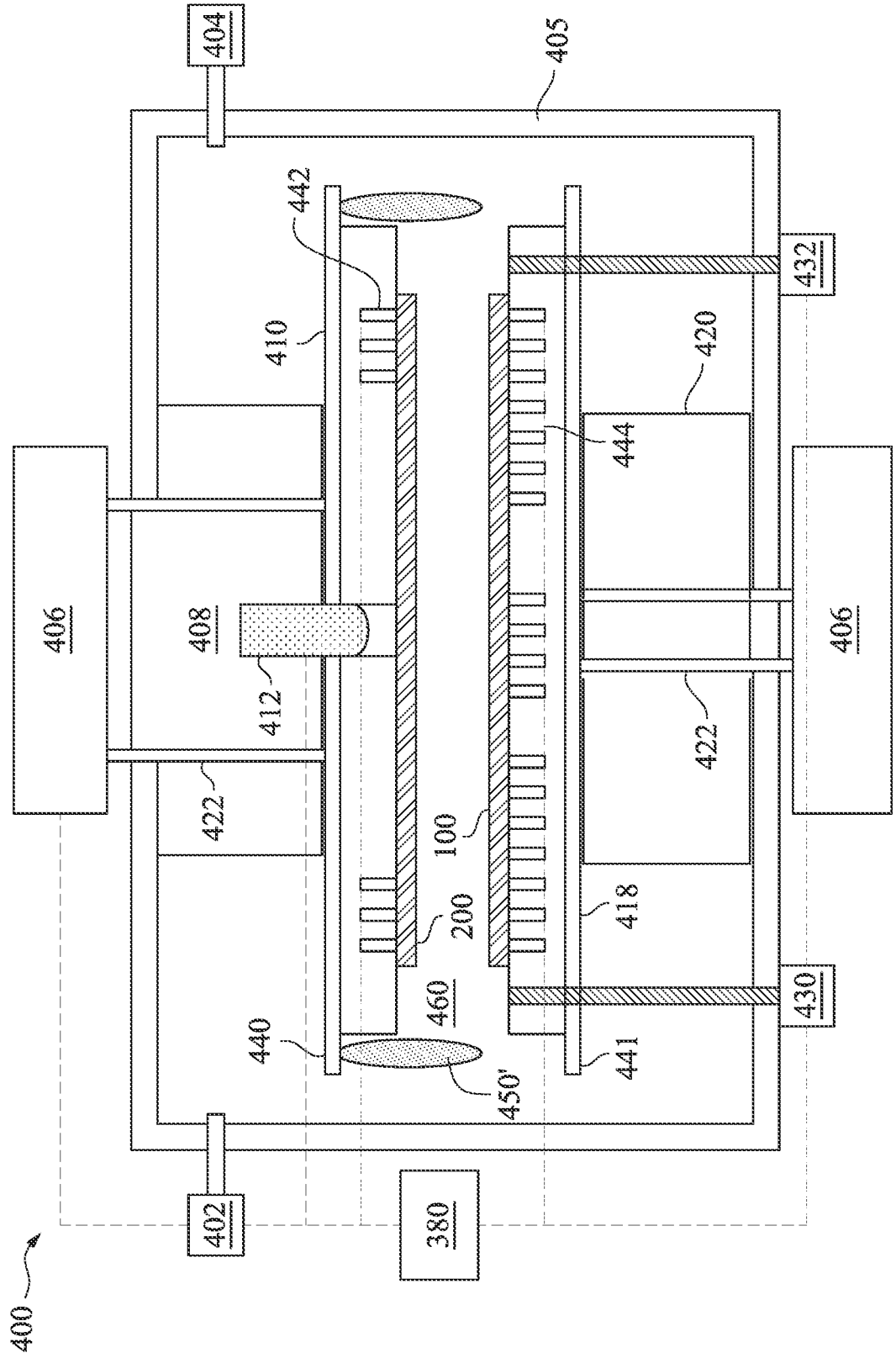
FIG. 4D illustrates a cross-sectional view of an intermediate step in a bonding process, in accordance with some embodiments.

Next, referring to FIG. 1 and FIGS. 4A-4C (with FIG. 4A illustrating a close-up view of the bonding station 400 in FIG. 1, FIG. 4B illustrating a bottom view of top wafer chuck 410, and FIG. 4C illustrating a top view of bottom wafer chuck 418), a transfer robot 306 within the bonding area 320 transfers the wafers 100 and 200 from the cleaning station 322 to the bonding station 400. The bonding station 400 comprises a chamber 405, one or more gas outlet(s) 404, and one or more gas inlet(s) 402. An ambient pressure inside the chamber 405 can be controlled by flowing gas/air into the chamber 405 through the gas inlet(s) 402 and removing gas/air from the chamber 405 via the gas outlet(s) 404 through the use of one or more vacuum pumps connected to the gas outlet(s) 404. The bonding station 400 comprises a top wafer chuck 410 and a bottom wafer chuck 418 that can be positioned to face each other. The top wafer chuck 410 and the bottom wafer chuck 418 are moveable relative to each other in order to move wafers mounted on the top wafer chuck 410 and the bottom wafer chuck 418 together for bonding. In some embodiments, the top wafer chuck 410 and the bottom wafer chuck 418 are used to bond two semiconductor wafers (e.g., the wafer 100 to the wafer 200) or two package components together. The top wafer chuck 410 is attached to a top arm 408, and the bottom wafer chuck 418 is attached to a bottom arm 420. FIG. 4D is illustrated in accordance with some embodiments in which the top wafer chuck 410 is mounted on a top plate 440 on the top arm 408 and the bottom wafer chuck 418 is mounted on a bottom plate 441 on the bottom arm 420.

The top wafer chuck 410 and the bottom wafer chuck 418 are used in order to hold and control the orientation and movement of the wafers 100 and 200 during the bonding process. In some embodiments, the top wafer chuck 410 and the bottom wafer chuck 418 comprise any suitable material that may be used to hold one of the wafers 100 and 200. For example, silicon based materials, such as glass, silicon oxide, silicon nitride, or other materials, such as aluminum oxide, combinations of any of these materials, or the like may be used. Additionally, the top wafer chuck 410 and the bottom wafer chuck 418 have diameters that are suitable to hold one of the wafers 100 and 200. As such, while the size of the top wafer chuck 410 and the bottom wafer chuck 418 will be in some ways dependent upon the size of the wafers 100 and 200, the top wafer chuck 410 and the bottom wafer chuck 418 can have diameters in a range of 250 mm to 300 mm. However, any suitable dimensions may be utilized.

A gasket 450 is disposed between the top wafer chuck 410 and the bottom wafer chuck 418 in order to form an airtight seal around a local process chamber 460, also referred to as a sealed region, between the top wafer chuck 410 and the bottom wafer chuck 418 when top wafer chuck 410 and the bottom wafer chuck 418 are moved closer together for a subsequent bonding process (see below, FIG. 5A). In some embodiments, the gasket 450 has a round or circular profile. The gasket 450 may comprise a compressible material, such as polytetrafluoroethylene, polybutadiene, silicone rubber, butyl rubber, nitrile rubber, natural rubber, fluoropolymer elastomers, the like, or a combination thereof. In some embodiments in accordance with FIGS. 4A-4B, the gasket 450 is attached to the top wafer chuck 410. In some embodiments, the gasket 450 is attached to the bottom wafer chuck 418. As illustrated in FIGS. 4A-4B, the gasket 450 is attached to the bottom surface of the top wafer chuck 410 using a suitable airtight adhesive such as an epoxy. However, any suitable adhesive may be used. In some embodiments illustrated in accordance with FIG. 4D, a gasket 450' is attached to the top plate 440 adjacent to the top wafer chuck 410. In some embodiments, the gasket 450' is attached to the bottom plate 441 adjacent to the bottom wafer chuck 418.

A pressure regulator comprising one or more gas inlet(s) 430 and/or one or more gas outlet(s) 432 can be used to control an ambient pressure inside the local process chamber 460 between the top wafer chuck 410 and the bottom wafer chuck 418 when top wafer chuck 410 and the bottom wafer chuck 418 are moved closer together for a subsequent bonding process (see below, FIG. 5A). In some embodiments, as illustrated in accordance with FIG. 4A, the gas inlet(s) 430 and the gas outlet(s) 432 pass through the bottom wafer chuck 418. In some embodiments, one or more of the gas inlet(s) 430 or the gas outlet(s) 432 pass through the top wafer chuck 410.

Furthermore, the bonding station 400 comprises one or more push pins 412. In some embodiments, the one or more push pins 412 are positioned to extend through top wafer chuck 410. The one or more push pins 412 are each surrounded by an airtight seal (not illustrated) so that the local process chamber 460 may be sealed by the gasket 450 when the top wafer chuck 410 and the bottom wafer chuck 418 are moved together. The one or more push pins 412 are subsequently used to warp or bend one or more of the wafers 100 and 200 (see below, FIG. 6A). By warping the wafers 100 and 200, physical contact is initially made at a center of the wafers 100 and 200 before allowing the wafers 100 and 200 to bond at the edges. The bottom surface of the top wafer chuck 410 has a plurality of vacuum zones 442 that are connected to one or more vacuum pumps 406 through a series of pipes 422. Each vacuum zone 442 is connected to a respective pipe 422 (not individually illustrated). The top surface of the bottom wafer chuck 418 has a plurality of vacuum zones 444 that are connected to one or more vacuum pumps 406 through respective pipes 422.

During operation, the vacuum pump 406 will evacuate any gases from the vacuum zones 442 and 444 across the bottom surface of the top wafer chuck 410 and across the top surface of the bottom wafer chuck 418, respectively, thereby lowering the pressure (also referred to as the chuck pressure) within these vacuum zones 442 and 444. When the wafer 200 is placed against the bottom surface of the top wafer chuck 410 and the chuck pressure within the vacuum zones 442 at the bottom surface of the top wafer chuck 410 has been reduced by the vacuum pump 406, the pressure difference (e.g., the difference between the pressure in the chamber 405 and the chuck pressure) between the side of the wafer 200 facing the vacuum zones 442 at the bottom surface of the top wafer chuck 410 and the side of the wafer 200 facing away from the vacuum zones 442 at the bottom surface of the top wafer chuck 410 will hold the wafer 200 against the bottom surface of the top wafer chuck 410.

Likewise, when the wafer 100 is placed against the top surface of the bottom wafer chuck 418 and the chuck pressure within the vacuum zones 444 at the top surface of the bottom wafer chuck 418 has been reduced by the vacuum pump 406, the pressure difference (e.g., the difference between the pressure in the chamber 405 and the chuck pressure) between the side of the wafer 100 facing the vacuum zones 444 at the top surface of the bottom wafer chuck 418 and the side of the wafer 100 facing away from the vacuum zones 444 at the top surface of the bottom wafer chuck 418 will hold the wafer 100 against the top surface of the bottom wafer chuck 418. The pressures of the vacuum zones 444 may be controlled individually by the controller 380 to adjust for any warpages of the wafer 100.

At the bonding station 400, the wafers 100 and 200 are mounted on the top wafer chuck 410 and the bottom wafer chuck 418. Once in place the top wafer chuck 410 and the bottom wafer chuck 418 may align the wafers 100 and 200 for bonding. In a particular embodiment the bonding station 400 may align the wafers 100 and 200 to an alignment accuracy in a range of 10 nm to 100 μm. However, any suitable alignment may be performed.

Figure 5A:
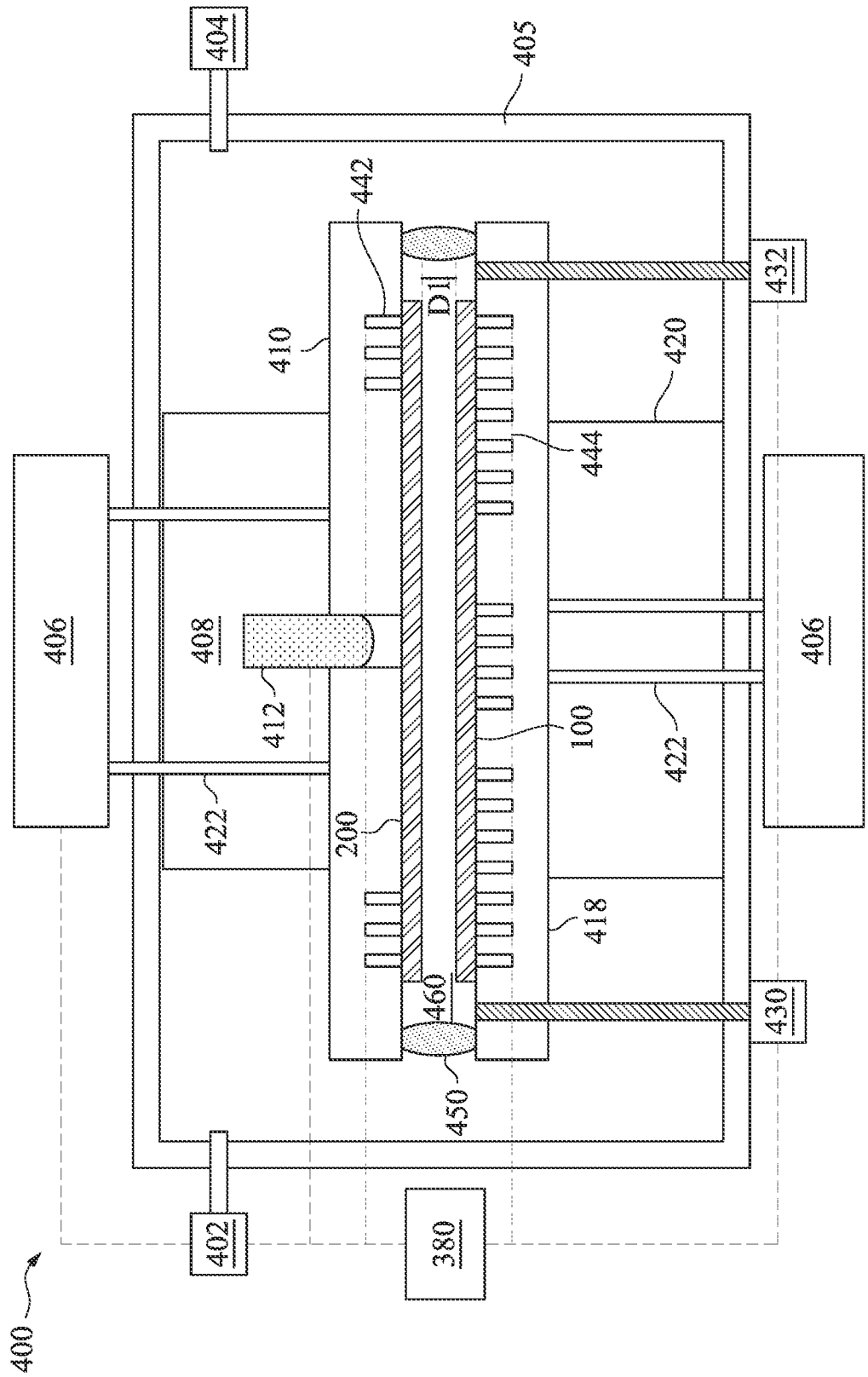
FIG. 5A illustrates a cross-sectional view of an intermediate step in a bonding process, in accordance with some embodiments.

In FIGS. 5A-5C, the top wafer chuck 410 and the bottom wafer chuck 418 move the wafers 100 and 200 together for bonding and the gasket 450 forms an airtight seal around the local process chamber 460 between the top wafer chuck 410 and the bottom wafer chuck 418. The wafers 100 and 200 are moved together to a separation by a distance D1 in a range of 10 μm to 1 mm. As illustrated in FIGS. 5B-5C, the gasket 450 makes airtight contact with the bottom surface of the top wafer chuck 410 and the top surface of the bottom wafer chuck 418. The gasket 450 is compressible to a thickness equivalent to the distance D1 in a range of 10 μm to 1 mm.

Ambient pressure in the local process chamber 460 is controlled by flowing gas/air into the local process chamber 460 through the gas inlet(s) 430 and removing gas/air from the chamber 405 via the gas outlets 404 through the use of one or more vacuum pumps connected to the gas inlet(s) 430 and the gas outlet(s) 432. In some embodiments, the local process chamber 460 has a volume in a range of 750 mm³ to 123000 mm³, and the pressure inside the local process chamber 460 can be controlled, such as by the controller 380 regulating the pressure using the gas inlet(s) 430 and the gas outlet(s) 432, at a faster speed than the pressure of the chamber 405 containing the top wafer chuck 410 and the bottom wafer chuck 418. This may enable the pressure inside the local process chamber 460 to be quickly adjusted and maintained, which may enable increased throughput and reduced cost in comparison with controlling the pressure inside the larger chamber 405. The airtight seal established by the gasket 450 around the local process chamber 460 allows for a gaseous purge capability in the local process chamber 460. In some embodiments, an $N_2$ purge is performed using the gas inlet(s) 430 after forming the airtight seal in order to remove moisture from the local process chamber 460. This may reduce edge bubble defects between the subsequently bonded wafers 100 and 200 caused by moisture condensation by the Joule-Thomson effect.

While the pressure inside the local process chamber 460 is adjusted, the controller 380 may maintain the pressure differential between the vacuum levels of the vacuum zones 442 and 444 and the pressure of the local process chamber 460 as constant. This may keep the force holding the wafers 100 and 200 on the bottom wafer chuck 418 and the top wafer chuck 410, respectively, from changing, which may reduce distortion of the wafers 100 and 200 during bonding.

Figure 6A:
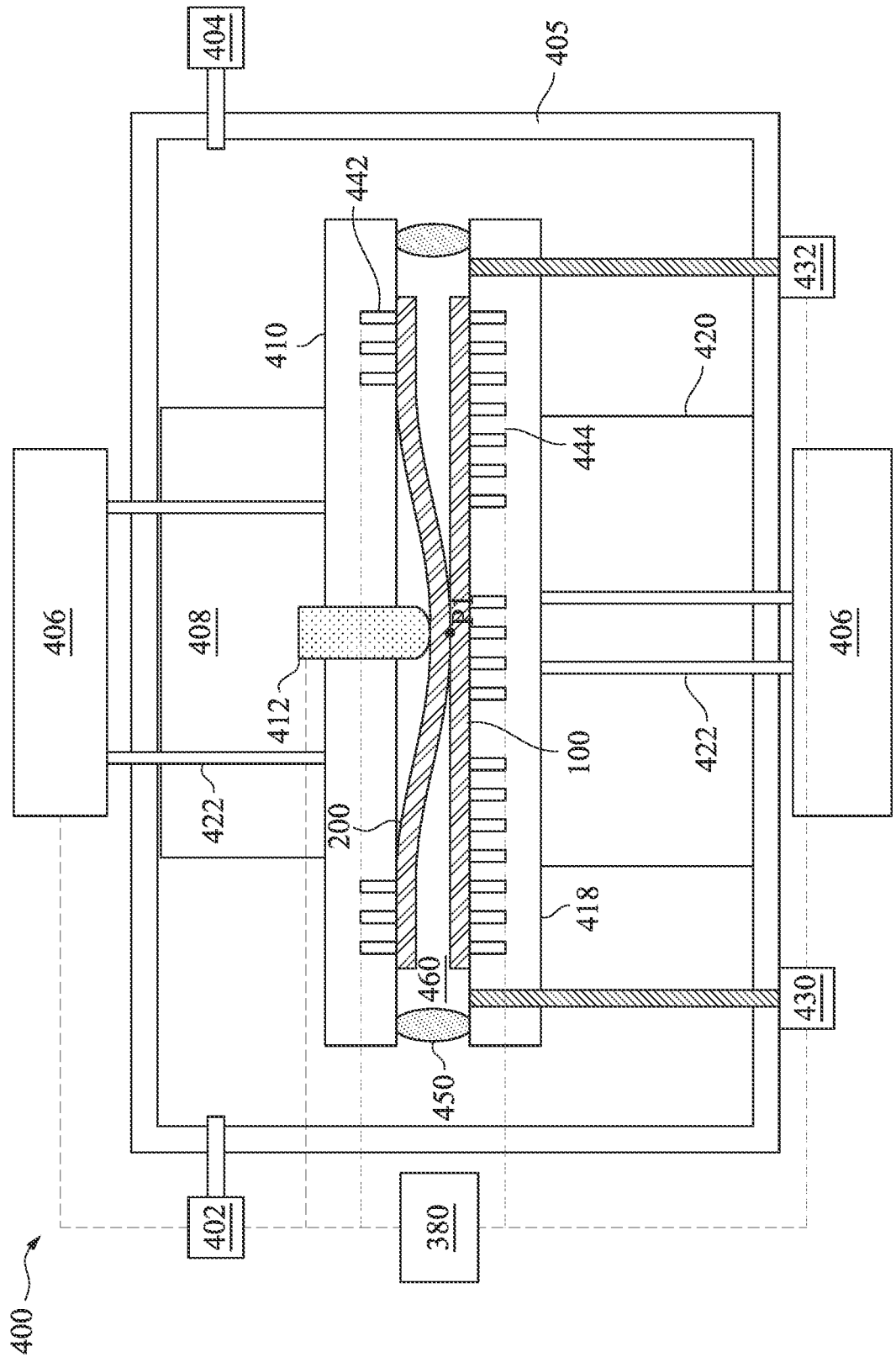
FIG. 6A illustrates a cross-sectional view of an intermediate step in a bonding process, in accordance with some embodiments.

FIG. 6A illustrates the initiation of a bonding process of the wafers 100 and 200. One or more of the push pins 412 are utilized to warp or deform one or more of the wafers 100 and/or 200 to initiate the bonding process. In some embodiments, the bonding process is performed by bringing the wafers 100 and 200 into contact by utilizing a combination of the top wafer chuck 410, the bottom wafer chuck 418, and the push pin 412 to apply pressure against the wafers 100 and 200 at a first point P1. For example, the push pin 412 may be extended through the top wafer chuck 410 to deform the wafer 200 and bring the wafer 200 into contact with the wafer 100 at the first point P1. The bonding then proceeds in a wave (also referred to as a bonding wave) from the first point P1 and moving outwards towards the edges of the wafers 100 and 200.

During the bonding process, the gasket 450 maintains an airtight seal of the local process chamber 460 between the top wafer chuck 410 and the bottom wafer chuck 418. The ambient pressure inside the local process chamber 460 can be maintained constant (a static mode) during the bonding process, or the ambient pressure inside the local process chamber 460 can be changed over time (a dynamic mode) as the bonding process proceeds.

In the static mode, the pressure in the local process chamber 460 is adjusted prior to the initiation of the bonding process and maintained at a constant pressure until the completion of the bonding process. In some embodiments, the pressure is set to a low pressure, such as a pressure less than 1 atmosphere, which may significantly increase the bonding wave velocity and allow for high throughput. In some embodiments, the pressure is set to a high pressure, such as a pressure greater than 1 atmosphere, which may decrease the bonding wave velocity and reduce distortion of the bonded wafers 100 and 200 caused by uneven bonding wave velocity.

In the dynamic mode, the pressure in the local process chamber 460 is changed over time during the bonding process. For example, the pressure may be set to less than 1 atmosphere prior to the initiation of the bonding process in order to reduce an initiation delay of the bonding wave, and the pressure is increased to greater than 1 atmosphere after the initiation of the bonding process to decrease the bonding wave velocity and reduce distortion of the bonded wafers 100 and 200 caused by uneven bonding wave velocity. In some embodiments, other dynamic pressure profiles are used in order to compensate for customized distortion patterns. For example, one dynamic pressure profile includes starting with a pressure greater than 1 atmosphere prior to the initiation of the bonding process, decreasing the pressure to less than 1 atmosphere as the bonding process is initiated by bringing the wafers 100 and 200 into contact with the push pin 412, and increasing the pressure to greater than 1 atmosphere as the bonding wave propagates across the wafers 100 and 200.

Figure 6B:
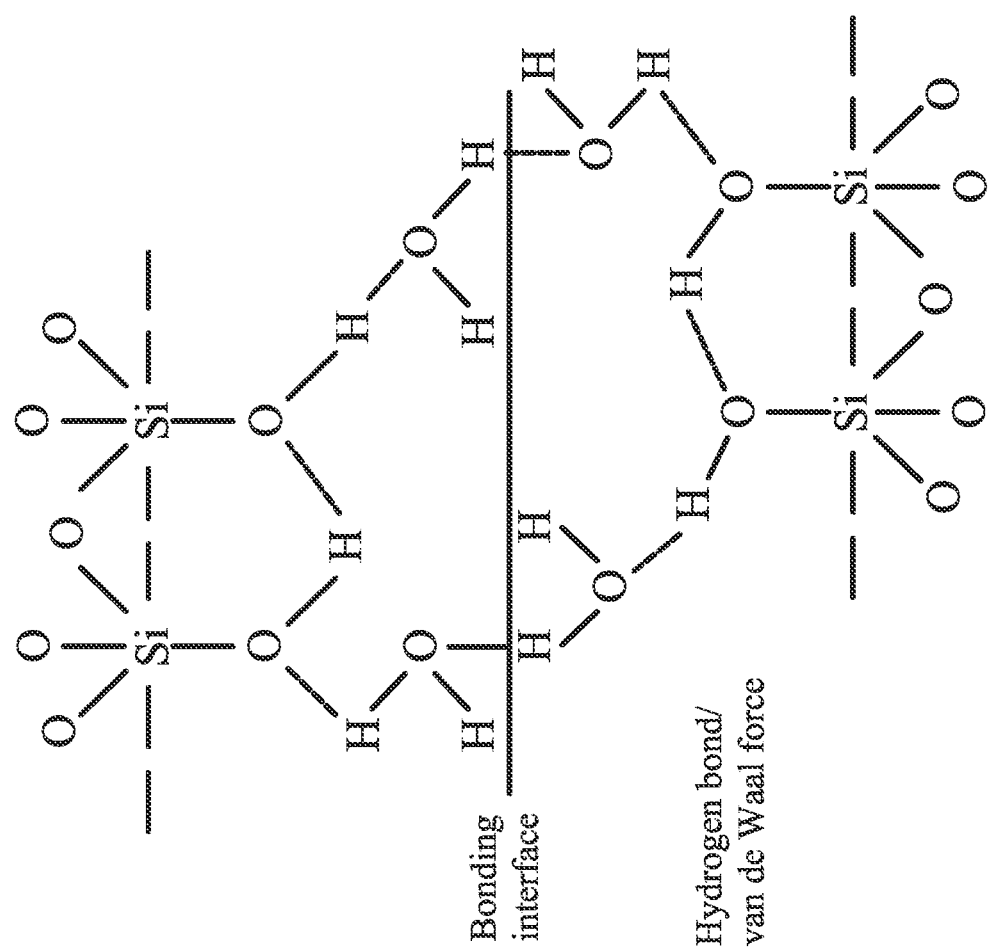
FIG. 6B illustrates a chemical reaction of an intermediate step in a bonding process, in accordance with some embodiments.

FIG. 6B illustrates a formation of bonds between the wafers 100 and 200 across the bonding interface between the wafers 100 and 200, in accordance with some embodiments in which the bonding process includes oxide-oxide bonding. As the bonding wave proceeds outwards from the first point P1, hydrogen bonds between hydrogen and oxygen atoms of water molecules attached to silanol groups on the surfaces of the wafers 100 and 200 may be formed, such as through Van der Waals forces.

Figure 7:
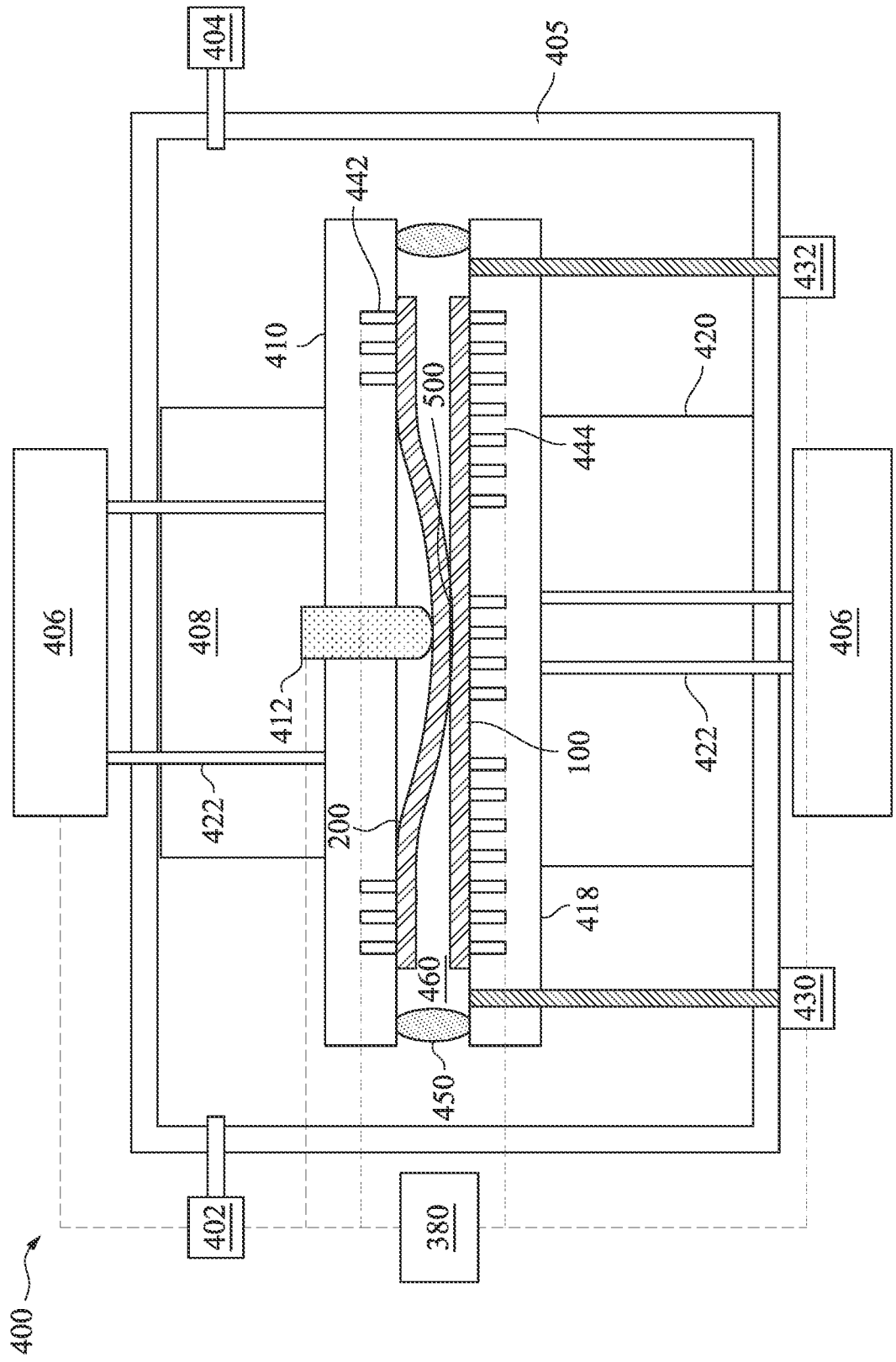
FIG. 7 illustrates a cross-sectional view of an intermediate step in a bonding process, in accordance with some embodiments.

FIG. 7 illustrates a bonding wave 500 propagating outwards from the first point P1 between the wafers 100 and 200. The bonding wave velocity is proportional to the ambient pressure and in some embodiments can be described by the expression $$V \propto P^{-1/2}$$

where V is the bonding wave velocity of the bonding wave and P is the ambient pressure. By adjusting the ambient pressure of the local process chamber 460, the bonding wave velocity may be controlled. For example, in the static mode, a pressure less than 1 atmosphere such as lower than 760 torr (e.g., a vacuum, or the like) may allow for high throughput by increasing the bonding wave velocity. The increased bond wave velocity V leads to a reduced bonding time needed to bond the wafers 100 and 200, which allows the wafer bonding system 300 to bond wafers together at a faster rate and therefore increase the wafer per hour (WPH) processing rate. A pressure greater than 1 atmosphere may reduce local stresses and bonding-induced distortion of the bonded wafers 100 and 200 caused by uneven bonding wave velocity by decreasing the bonding wave velocity. This leads to improved bonding alignment between the wafers 100 and 200. In the dynamic mode, the ambient pressure of the local process chamber 460 may be increased or decreased as the bonding wave 500 propagates to enable bonding wave velocity control at different radial distances.

Figure 8:
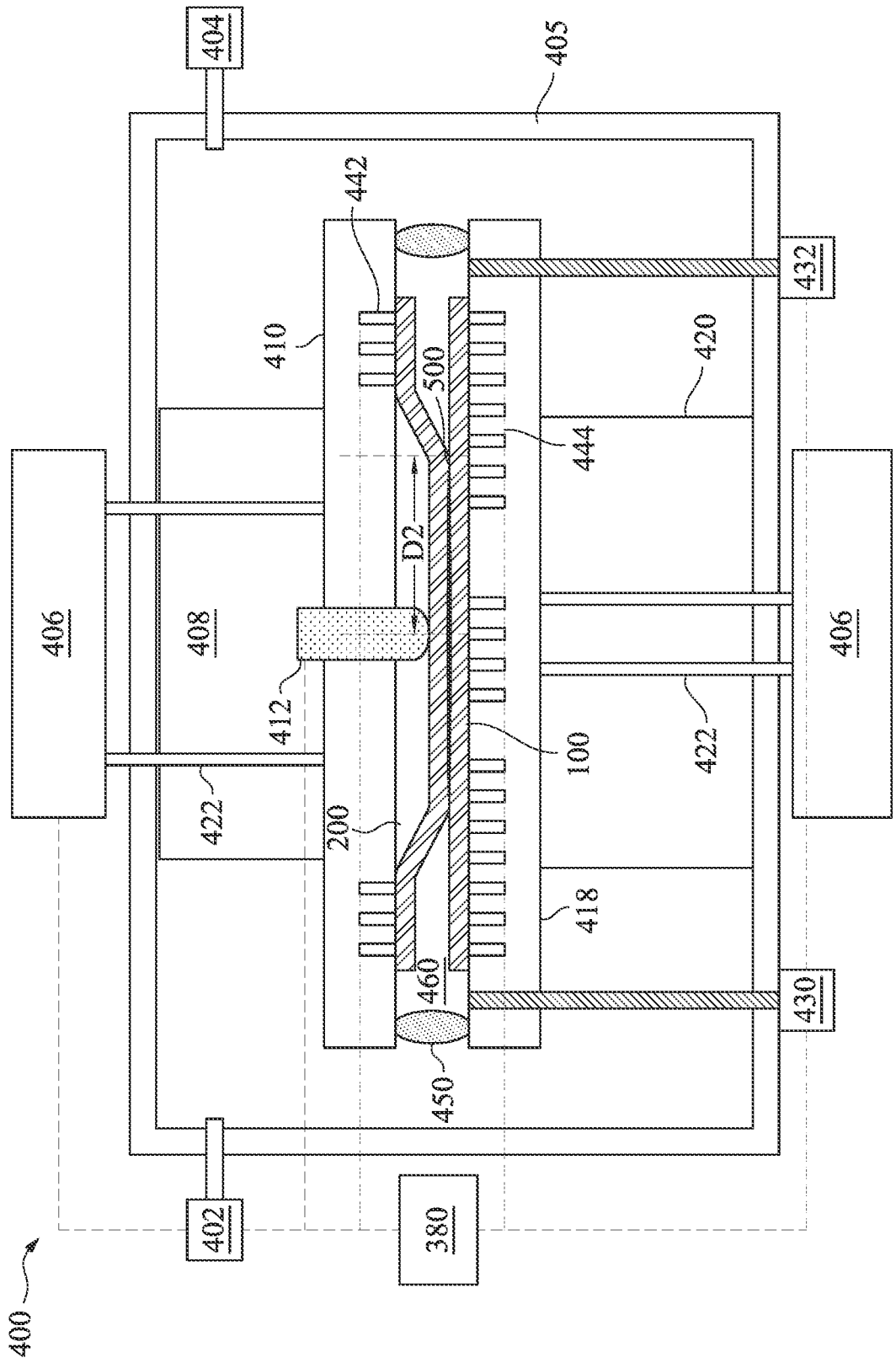
FIG. 8 illustrates a cross-sectional view of an intermediate step in a bonding process, in accordance with some embodiments.

FIG. 8 illustrates the bonding wave 500 between the wafers 100 and 200 reaching a distance D2 from the point P1, in accordance with some embodiments. Once the bonding wave 500 reaches a distance D2 in a range of 50 mm to 120 mm depending on film properties and patterning scheme, the vacuum zones 442 on the top wafer chuck 410 are deactivated. This releases the wafer 200 from the top wafer chuck 410 and allows the bonding wave 500 to propagate to the edges of the wafers 100 and 200. In some embodiments, the ambient pressure of the local process chamber 460 is controlled to be higher than 1 atmosphere as the bonding wave 500 propagates to the edges of the wafers 100 and 200, which may reduce local stresses and bonding-induced distortion, improve bonding alignment, and decrease edge bubbles formed between the wafers 100 and 200 due to moisture condensation from the Joule-Thomson effect.

Figure 9A:
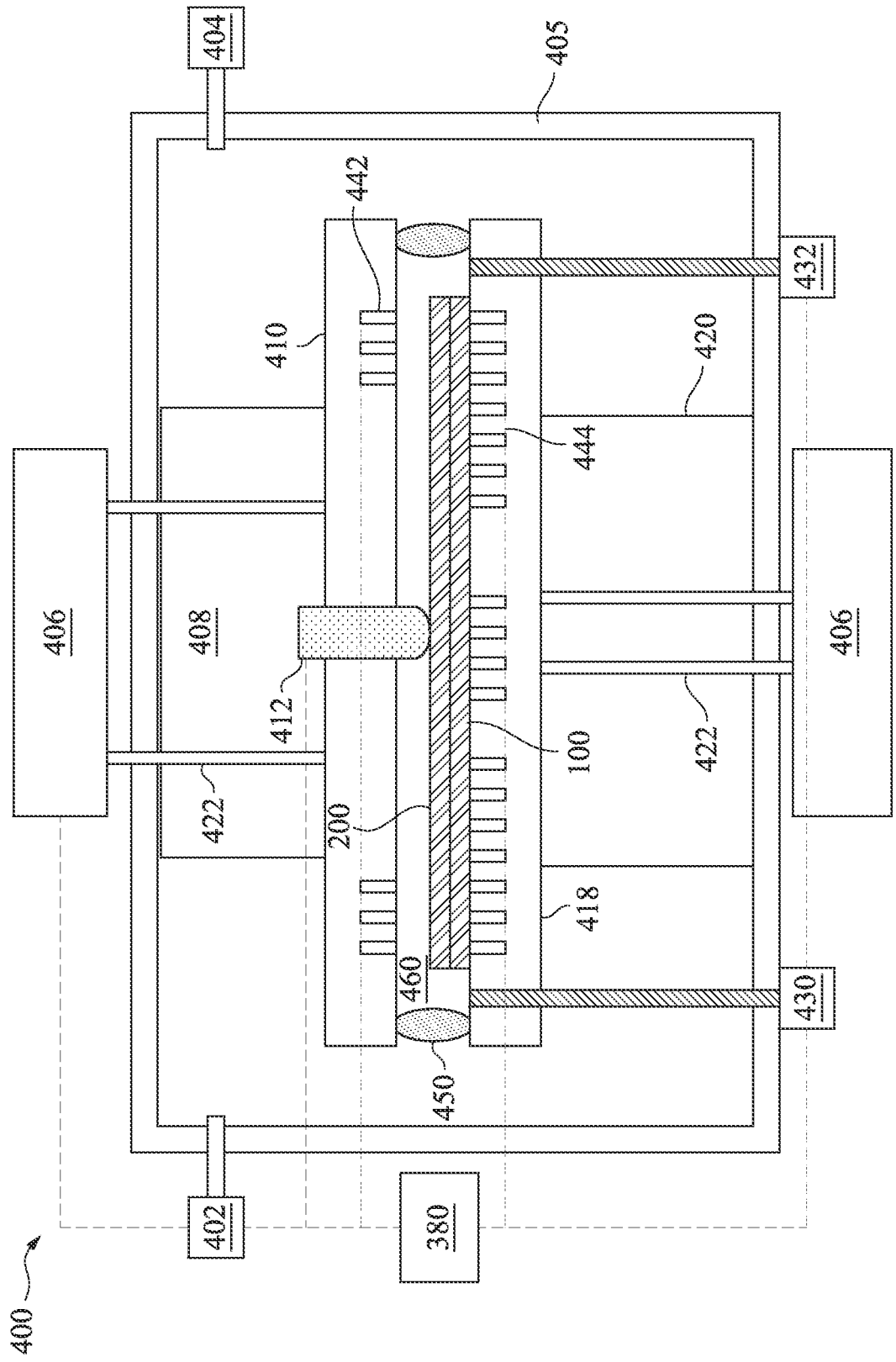
FIG. 9A illustrates a cross-sectional view of an intermediate step in a bonding process, in accordance with some embodiments.
Figure 9B:
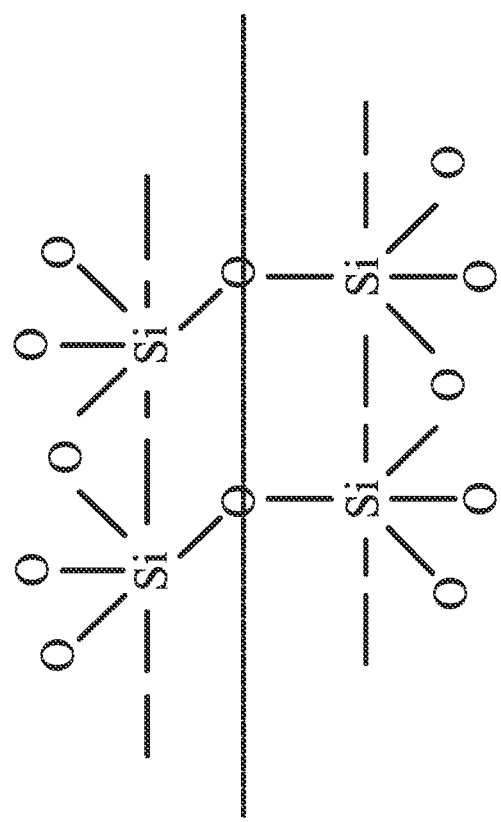
FIG. 9B illustrates a chemical reaction of an intermediate step in a bonding process, in accordance with some embodiments.

FIG. 9A illustrates the wafers 100 and 200 after the bonding wave 500 has propagated to the edges of the wafers 100 and 200. Subsequently, in some embodiments an anneal is performed to form permanent adhesion (e.g., fusion bond) of the wafers 100 and 200 together by forming chemical bonds between the oxide surfaces. For example, FIG. 9B illustrates the atoms (such as oxygen atoms) on the interface of the wafers 100 and 200 forming chemical or covalence bonds (such as Si—O—Si bonds) with the atoms (such as silicon atoms) in the wafers 100 and 200. Slight variations in surfaces of the bonding structures can be overcome through the annealing process. In some embodiments a bond strength of about 0.5 to 10 $J/m^2$ can be exerted to hold the wafers 100 and 200 together.

After the bonding process is completed, the one or more push pins 412 is retracted and the top wafer chuck 410 and bottom wafer chuck 418 are separated, breaking the seal of the local process chamber 460. The bonded wafers 100 and 200 are then removed from the bottom wafer chuck 418, such as by a transfer robot 306. The bonded wafers 100 and 200 may then be transferred back to the loading stations 202 or 204 by the transfer robot 306, where the bonded wafers 100 and 200 are unloaded from the wafer bonding system 300.

Figure 10:
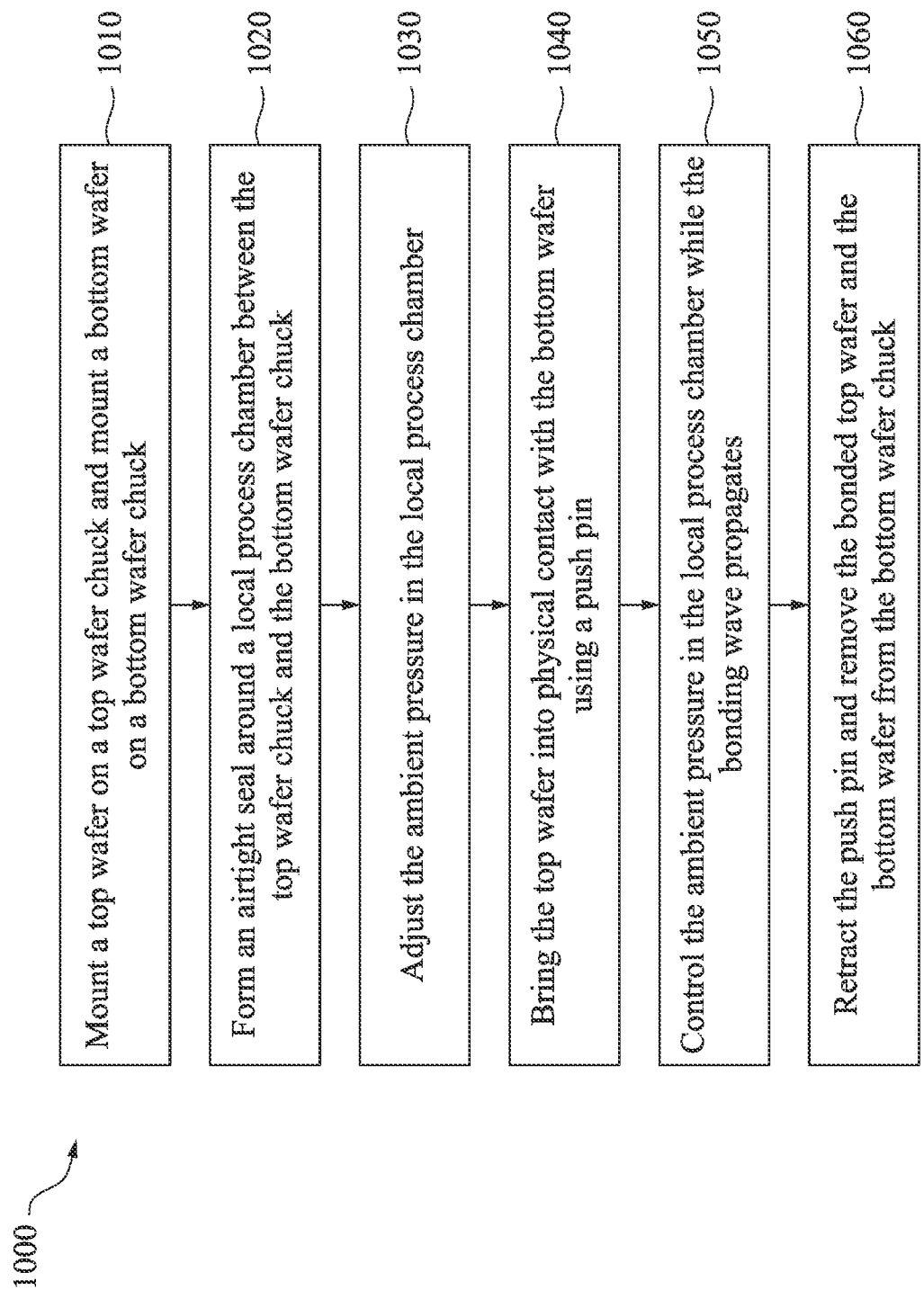
FIG. 10 illustrates a flow chart of a method of a bonding process, in accordance with some embodiments.

FIG. 10 illustrates a method 1000 of bonding two wafers 100 and 200 as illustrated in FIGS. 1 through 9B. In step 1010, a wafer 200 is mounted on a top wafer chuck 410 and a wafer 100 is mounted on a bottom wafer chuck 418, as described above with respect to FIG. 4A. In step 1020, an airtight seal is formed around the local process chamber 460 between the top wafer chuck 410 and the bottom wafer chuck 418 by the gasket 450, as described above with respect to FIGS. 5A-5C. In step 1030, the ambient pressure in the local process chamber 460 is adjusted, as described above with respect to FIGS. 5A-5C. In step 1040, the wafer 200 is brought into physical contact with the wafer 100 by using a push pin 412, as described above with respect to FIG. 6A. In step 1050, the ambient pressure in the local process chamber 460 is controlled while the bonding wave 500 propagates, as described above with respect to FIGS. 6A-7. In step 1060, the push pin 412 is retracted and the bonded wafers 100 and 200 are removed from the bottom wafer chuck 418, as described above in respect to FIGS. 9A-9B.

Embodiments may achieve advantages. A wafer bonding system bonds a first wafer to a second wafer in an airtight local process chamber sealed by a gasket between wafer chucks holding the first and second wafers. Increased throughput and reduced cost for the bonding process are enabled by quickly adjusting and maintaining the ambient pressure inside the smaller volume of the local process chamber. By reducing ambient pressure in the local process chamber, bonding wave velocity is increased, which may raise the wafer per hour (WPH) processing rate. By increasing the ambient pressure in the local process chamber, the bonding wave velocity is decreased, which reduces local stresses and bonding-induced distortion of the bonded wafers caused by uneven bonding wave velocity. Edge bubble defects can be decreased by gaseous purges to reduce moisture enabled by the airtight seal of the local process chamber.

In accordance with an embodiment, a method of forming a semiconductor device includes: mounting a bottom wafer on a bottom chuck; mounting a top wafer on a top chuck, wherein one of the bottom chuck and the top chuck has a gasket; moving the top chuck towards the bottom chuck, wherein the gasket forms a sealed region between the bottom chuck and the top chuck around the top wafer and the bottom wafer; adjusting an ambient pressure in the sealed region; and bonding the top wafer to the bottom wafer. In some embodiments of the method, the ambient pressure is adjusted to a pressure lower than 760 torr. In some embodiments of the method, the ambient pressure is adjusted to a pressure greater than 1 atmosphere. In some embodiments of the method, the top wafer is mounted to the top chuck using a vacuum zone. In some embodiments of the method, while adjusting the ambient pressure in the sealed region, a vacuum pressure of the vacuum zone is adjusted to maintain a constant pressure differential between the ambient pressure and the vacuum pressure. In some embodiments of the method, the ambient pressure is held constant while bonding the top wafer to the bottom wafer. In some embodiments of the method, the ambient pressure is changed while bonding the top wafer to the bottom wafer.

In accordance with another embodiment, a method of forming a semiconductor device includes: forming an airtight seal around a local process chamber, the local process chamber being bounded by a first wafer chuck, a second wafer chuck, and a gasket, a first wafer being held by the first wafer chuck, a second wafer being held by the second wafer chuck; setting an ambient pressure in the local process chamber to a first pressure; bringing the first wafer and the second wafer into physical contact; changing the ambient pressure in the local process chamber to a second pressure while a bonding wave propagates between the first wafer and the second wafer; and removing the bonded first wafer and second wafer from the local process chamber. In some embodiments, the method further includes purging the local process chamber with $N_2$. In some embodiments of the method, the gasket includes polytetrafluoroethylene. In some embodiments of the method, the gasket is mounted on the first wafer chuck, the gasket surrounding the first wafer. In some embodiments of the method, forming the airtight seal includes moving the first wafer chuck towards the second wafer chuck, the moving the first wafer chuck towards the second wafer chuck bringing the gasket into physical contact with the second wafer chuck. In some embodiments of the method, bringing the first wafer and the second wafer into physical contact includes extending a push pin through the first wafer chuck. In some embodiments of the method, the push pin is surrounded by an airtight seal.

In accordance with yet another embodiment, a wafer bonding system includes: a first wafer chuck in a chamber, the first wafer chuck having a first surface to support a first wafer; a second wafer chuck having a second surface to support a second wafer, the second surface being opposite the first surface, the second wafer chuck and the first wafer chuck being movable relative to each other; a gasket between the first wafer chuck and the second wafer chuck, the gasket forming an airtight seal around a local process chamber between the first wafer chuck and the second wafer chuck; and a pressure regulator, the pressure regulator configured to control an ambient pressure in the local process chamber. In some embodiments of the wafer bonding system, the gasket includes a compressible material. In some embodiments of the wafer bonding system, the compressible material is polytetrafluoroethylene, silicone rubber, butyl rubber, or a fluoropolymer elastomer. In some embodiments of the wafer bonding system, the gasket is compressible to a thickness in a range of 10 µm to 1 mm. In some embodiments of the wafer bonding system, the gasket has a round profile. In some embodiments of the wafer bonding system, the pressure regulator includes a gas inlet and a gas outlet.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    mounting a bottom wafer on a bottom chuck;
    mounting a top wafer on a top chuck, wherein a vacuum pressure is applied to at least one of the bottom wafer through the bottom chuck and the top wafer through the top chuck, wherein one of the bottom chuck and the top chuck has a gasket;
    moving the top chuck towards the bottom chuck, wherein the gasket forms a sealed region between the bottom chuck and the top chuck around the top wafer and the bottom wafer;
    adjusting an ambient pressure in the sealed region, wherein while adjusting the ambient pressure in the sealed region, the vacuum pressure is adjusted to maintain a constant pressure differential between the ambient pressure and the vacuum pressure; and
    bonding the top wafer to the bottom wafer.

2. The method of claim 1, wherein the ambient pressure is adjusted to a pressure lower than 760 torr.

3. The method of claim 1, wherein the ambient pressure is adjusted to a pressure greater than 1 atmosphere.

4. The method of claim 1, wherein the top wafer is mounted to the top chuck using a vacuum zone for applying the vacuum pressure.

5. The method of claim 1, wherein the ambient pressure is held constant while bonding the top wafer to the bottom wafer.

6. The method of claim 1, wherein the ambient pressure is changed while bonding the top wafer to the bottom wafer.

7. A method of forming a semiconductor device, the method comprising:
    forming an airtight seal around a local process chamber, the local process chamber being bounded by a first wafer chuck, a second wafer chuck, and a gasket, wherein a vacuum pressure is applied to at least one of a first wafer through the first wafer chuck and a second wafer through the second wafer chuck, the first wafer being held by the first wafer chuck, the second wafer being held by the second wafer chuck;
    setting an ambient pressure in the local process chamber to a first pressure;
    bringing the first wafer and the second wafer into physical contact;
    changing the ambient pressure in the local process chamber to a second pressure while a bonding wave propagates between the first wafer and the second wafer, wherein while changing the ambient pressure in the local process chamber, the vacuum pressure is adjusted to maintain a constant pressure differential between the ambient pressure and the vacuum pressure; and
    removing the bonded first wafer and second wafer from the local process chamber.

8. The method of claim 7, further comprising purging the local process chamber with $N_2$.

9. The method of claim 7, wherein the gasket comprises polytetrafluoroethylene.

10. The method of claim 7, wherein the gasket is mounted on the first wafer chuck, the gasket surrounding the first wafer.

11. The method of claim 10, wherein forming the airtight seal comprises moving the first wafer chuck towards the second wafer chuck, the moving the first wafer chuck towards the second wafer chuck bringing the gasket into physical contact with the second wafer chuck.

12. The method of claim 7, wherein bringing the first wafer and the second wafer into physical contact comprises extending a push pin through the first wafer chuck.

13. The method of claim 12, wherein the push pin is surrounded by an airtight seal.

14. A wafer bonding system, comprising:
    a first wafer chuck in a chamber, the first wafer chuck having a first surface to support a first wafer;
    a second wafer chuck having a second surface to support a second wafer, the second surface being opposite the first surface, the second wafer chuck and the first wafer chuck being movable relative to each other;
    a gasket between the first wafer chuck and the second wafer chuck, the gasket forming an airtight seal around a local process chamber between the first wafer chuck and the second wafer chuck; and
    a pressure regulator, the pressure regulator configured to control an ambient pressure in the local process chamber, wherein the pressure regulator comprises a gas inlet and a gas outlet.

15. The wafer bonding system of claim 14, wherein the gasket comprises a compressible material.

16. The wafer bonding system of claim 15, wherein the compressible material is polytetrafluoroethylene, silicone rubber, butyl rubber, or a fluoropolymer elastomer.

17. The wafer bonding system of claim 15, wherein the gasket is compressible to a thickness in a range of 10 µm to 1 mm.

18. The wafer bonding system of claim 14, wherein the gasket has a round profile.

19. The wafer bonding system of claim 14, wherein at least one of the second wafer chuck and the first wafer chuck include a push pin extending there through.

20. The wafer bonding system of claim 19, wherein the push pin is surrounded by an airtight seal.

* * * * *